United States Patent
Kurihara

(10) Patent No.: US 7,847,599 B2
(45) Date of Patent: Dec. 7, 2010

(54) START SIGNAL DETECTION CIRCUIT

(75) Inventor: Tomonobu Kurihara, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 46 days.

(21) Appl. No.: 12/422,531

(22) Filed: Apr. 13, 2009

(65) Prior Publication Data

US 2009/0261863 A1 Oct. 22, 2009

(30) Foreign Application Priority Data

Apr. 17, 2008 (JP) ............... 2008-107909

(51) Int. Cl.
*H03K 5/24* (2006.01)
(52) U.S. Cl. .......................... 327/89; 327/77
(58) Field of Classification Search .............. 327/89, 327/52, 56, 77, 102
See application file for complete search history.

(56) References Cited

U.S. PATENT DOCUMENTS 6,020,768 A * 2/2000 Lim ........................ 327/77
6,661,258 B1 * 12/2003 Huang ..................... 327/81
7,215,162 B2 * 5/2007 Mizuno et al. ............. 327/102

FOREIGN PATENT DOCUMENTS

JP 2006-174101 A 6/2006

* cited by examiner

*Primary Examiner*—Hai L Nguyen
(74) *Attorney, Agent, or Firm*—Sughrue Mion, PLLC

(57) ABSTRACT

A start signal detection circuit includes a wave-detection circuit 1 outputting a voltage in accordance with an envelope of a radio signal from an output point B, a reference voltage generation circuit 2 outputting a voltage at the output point B at a non-signal state as a reference voltage to a reference point C, and a differential amplification circuit 3 amplifying and outputting a voltage difference between the output point B and the reference point C.

7 Claims, 9 Drawing Sheets

US 7,847,599 B2

START SIGNAL DETECTION CIRCUIT

BACKGROUND

1. Field of the Invention

The present invention relates to a start signal detection circuit that detects an RF (Radio Frequency) signal and outputs an envelope signal for the RF signal.

2. Description of Related Art

In recent years, reduction in power consumption has been desired in wireless communication devices, which have been becoming widespread, so that they can be used for a longer time with their internal batteries. In the past, systems to reduce the overall power consumption of a wireless communication device by operating the main part of the wireless communication device intermittently according to the presence or absence of an RF signal to be received have been known. Such systems are equipped with a start signal detection circuit (wake-up circuit) to output a start signal used to start the main part. The start signal detection circuit is mainly composed of a wave-detection circuit to detect an RF signal, a differential amplification circuit to amplify the detected signal, and a comparison circuit (comparator) to determine the presence or absence of the RF signal. Since the start signal detection circuit is required to operate at all times, these circuits constituting the start signal detection circuit are desired to have low power consumption and to operate at a low operating voltage.

Japanese Unexamined Patent Application Publication No. 2006-174101 discloses a circuit to enable both a wave-detection circuit and a differential amplification circuit constituting a start signal detection circuit to operate at a low voltage. As shown in FIG. 8, this start signal detection circuit includes a wave-detection circuit 90, a differential amplification circuit 91, and a reference voltage generation circuit 92. The wave-detection circuit 90 is configured to output an envelope signal for an RF signal, which is input to a detection point A through a matching circuit 10, from an output point B based on the RF signal. The reference voltage generation circuit 92 generates a voltage at the detection point A at a non-signal state where no RF signal is received at an antenna 13 as a reference voltage, and supplies the reference voltage to a reference point C. The differential amplification circuit 91 receives a voltage at the output point B and a voltage at the reference point C, and outputs a voltage difference as a start signal detection signal. Elements Tr34, Tr33, Tr32, Tr31, Tr14, and Tr24 constitute a current mirror circuit. This current mirror circuit serves as a constant current source for the differential amplification circuit 91.

The wave-detection circuit 90 includes a wave-detection diode (first diode) Tr12, a second diode Tr11, the transistor Tr14, which is also a component of the current mirror circuit, and a capacitor C11. The anode of the second diode Tr11 is connected to a power supply Vcc, and the cathode is connected to the detection point A. The anode of the wave-detection diode (first diode) Tr12 is connected to the detection point A and the cathode is connected to the output point B, which serves as the output of the wave-detection circuit. The first capacitor C11 is connected between the output point B and an alternating ground. The second diode Tr11, the wave-detection diode Tr12, and the first capacitor C11 constitute a half-wave double voltage rectification circuit. The detection capacitor C10 is a component of the matching circuit 10, and the matching circuit 10 is connected to the antenna 13.

The differential amplification circuit 91 includes a first PNP-type transistor Tr13, a second PNP-type transistor Tr23, load transistors Tr15 and Tr25, and the transistor Tr31, which is also a component of the current mirror circuit. The emitters of the first PNP-type transistor Tr13 and the second PNP-type transistor Tr23 are connected with each other at a connection point "a", and the transistor Tr31 is connected between the connection point "a" and the power supply Vcc. The load transistors Tr15 and Tr25, which serve as an active load, are connected between the collectors of the respective first and second PNP-type transistors Tr13 and Tr23 and a ground.

The reference voltage generation circuit 92 includes a third transistor Tr21, a fourth transistor Tr22, a second capacitor C21, and the transistor Tr24, which is also a component of the current mirror circuit. The anode of the third transistor Tr21 is connected to the power supply Vcc, and the cathode is connected to the anode of the fourth transistor Tr22. The cathode of the fourth transistor Tr22 is connected to the base of the second PNP-type transistor Tr23, the second capacitor C21, and the collector of the transistor Tr24. The other terminal of the second capacitor C21 is connected to a ground.

Next, the operation of the start signal detection circuit described in Japanese Unexamined Patent Application Publication No. 2006-174101 is explained hereinafter with reference to FIG. 9. FIG. 9(a) to FIG. 9(d) illustrate a basic operation from an initial state before detecting an RF signal to a state where the RF signal is detected in a simplistic manner. Assume that a voltage at the detection point A is $V_A$, a voltage at the output point B is $V_B$, a current flowing to the wave-detection diode Tr12 is $I_d$, the current flowing to the first capacitor C11 is $I_c$, and the collector current of the transistor Tr14 is $I_1$. The voltage between the anode and the cathode of the wave-detection diode Tr12, i.e., a voltage difference $V_A-V_B$ is referred to as $V_d$. Furthermore, the forward voltages of the second diode Tr11 and the wave-detection diode Tr12 are defined as VF.

As shown in FIG. 9(a), in the initial state where no RF signal is input, the forward voltage VF is generated across the second diode Tr11 and the wave-detection diode Tr12 in accordance with the current $I_1$. The voltage $V_A$ at the detection point A becomes a voltage lower than the power supply Vcc by the forward voltage VF. The voltage $V_B$ at the output point B becomes a voltage further lower than the voltage $V_A$ by the forward voltage VF of the wave-detection diode Tr12.

Next, when an RF signal begins to be received by the antenna 13, the RF signal is input to the anode of the wave-detection diode Tr12 through the matching circuit 10 (capacitor C10). Among the waveforms of the RF signal, the first one waveform is discussed hereinafter. As shown in FIG. 9(b), the anode-cathode voltage $V_d$ ($=V_A-V_B$) of the wave-detection diode Tr12 becomes a voltage obtained by adding the input of the RF signal to the forward voltage VF. Furthermore, the current that flows to the wave-detection diode Tr12 by the input of the RF signal becomes very large when the RF input (voltage $V_d$) swings to the high-voltage side (state A) because of the current-voltage characteristic of a diode shown in FIG. 10. On the other hand, when the RF input (voltage $V_d$) swings to the low-voltage side (state B), almost no current $I_d$ flows and it becomes around 0 A.

As shown in FIG. 9(c), the current $I_d$, which flows to the wave-detection diode Tr12, is a current obtained by adding the direct current $I_1$ by the transistor Tr14 to the current resulting from the input of the RF signal. The current resulting from the input of the RF signal flows into the first capacitor C11 as a current $I_c$. Note that the magnitude of the positive current that flows into the first capacitor C11 while the RF input (voltage $V_d$) swings to the high-voltage side (state A) is larger than the magnitude of the negative current that flows out from the first capacitor C11 to the output point B while the RF input (voltage $V_d$) swings to the low-voltage side (stage B). Therefore, the anode-cathode voltage of the first capacitor C11, i.e., the voltage $V_B$ at the output point B rises. In FIG. 9(a), this voltage rise is omitted and the voltage $V_B$ at the output point B during the period corresponding to the first one waveform of the detected RF signal is illustrated as a constant voltage to simplify the explanation.

The above-described behavior is repeated when the second waveform and subsequent waveforms of the RF signal are received. In this way, the voltage $V_B$ gradually increases. Since the voltage $V_B$ at the output point B rises, the voltage $V_d$, which is the voltage between the terminals of the wave-detection diode Tr12, becomes smaller as shown in FIG. 9(b). FIG. 11 shows a current-voltage characteristic of a diode in a state where the voltage between the terminals is small. The voltage $V_d$ of the wave-detection diode is small. Therefore, even when the RF signal swings to the high-voltage side, the current $I_d$ that flows to the wave-detection diode Tr12 exceeds the current $I_1$ that flows to the collector of the transistor Tr14 only when the RF signal is at or near its peak.

As shown in FIG. 9(d), only when the current $I_d$ flowing to the wave-detection diode Tr12 exceeds the collector current $I_1$ of the transistor Tr14, a current flows into the first capacitor C11. The current $I_c$ that flows into the first capacitor C11 becomes positive during that period, but the current $I_c$ becomes negative during the remaining period since a current flows out from the first capacitor C11 and drawn into the transistor Tr14. During one waveform of the RF signal, when the current flowing into the first capacitor C11 is balanced with the current flowing out from the first capacitor C11, i.e., when the mean value of the current $I_c$ becomes zero, the voltage $V_B$ becomes a stable state (state C).

After the voltage $V_B$ becomes stable, the peak value of the current $I_d$ flowing to the wave-detection diode Tr12 becomes a value obtained in accordance with the peak value of the RF signal. By selecting appropriate values for the collector current $I_1$ of the transistor Tr14, the first capacitor C11, and the matching circuit 10 (capacitor C10), a wave-detection output voltage in accordance with the envelope of the RF signal can be obtained.

Meanwhile, no RF signal is input to the transistors Tr21 and Tr22, and therefore the voltage $V_C$ at the reference point C does not change. The voltage $V_C$ remains at the voltage equal to the voltage $V_B$ at the output point B at a non-signal state. The voltages $V_B$ and $V_C$ are input to the differential amplification circuit composed of the transistors Tr13 and Tr23, and their voltage difference is amplified. In this manner, a start signal detection signal that varies in accordance with the envelope of the RF signal and is amplified by the differential amplification circuit 91 is obtained as the output of the start signal detection circuit.

SUMMARY

The present inventors have found a following problem. In the start signal detection circuit described in Japanese Unexamined Patent Application Publication No. 2006-174101, the anode of the wave-detection diode Tr12 is connected to the detection point A and the cathode is connected to the output point B. That is, the wave-detection diode Tr12 is configured to detect a voltage on the high-voltage side of the RF signal. Therefore, the voltage $V_B$ at the output point B of the wave-detection circuit 90 becomes a voltage obtained by subtracting the combined forward voltages of two serially-connected diodes, i.e., the voltage 2VF from the power supply Vcc. That is, a bias voltage supplied to the differential amplification circuit 91, which is connected at the subsequent stage to the wave-detection circuit 90, becomes a voltage Vcc-2VF. Note that the forward voltage VF of a diode using a Si PN-junction is around 0.7 V. Therefore, when the power supply Vcc is a low voltage around 2 V, the bias voltage supplied to the differential amplification circuit 91 become around 0.6 V.

In general, a transistor that uses holes as a carrier, such as a PNP transistor and a P-type field effect transistor, has a larger parasitic capacitance and an inferior frequency characteristic in comparison to a transistor that uses charges as a carrier, such as a NPN transistor and a N-type field effect transistor. Therefore, with regard to the differential amplification circuit 91, it is preferable to construct the differential pair with NPN transistors or N-type transistors in which charges are used as a carrier so that it has a better frequency characteristic.

However, in a differential amplification circuit composed of NPN transistors or the likes, when a current mirror circuit is used as the current source, it requires, to say the least, a drive voltage equal to or larger than a voltage obtained by adding the saturation voltage of a transistor to the forward voltage VF of a diode as the bias voltage. Furthermore, when a resistor is used as a substitute for the current source, a drive voltage equal to or larger than the forward voltage VF is required. Accordingly, in a case where a start signal detection circuit in the related art is to be driven by a low voltage around 2 V, if a differential amplification circuit composed of transistors that use charges as a carrier is connected at the subsequent stage to the wave-detection circuit 90, it does not work properly. Accordingly, a differential amplification circuit composed of NPN transistors or the likes cannot be used for such cases.

That is, there has a problem that it is necessary to increase the drive voltage of a start signal detection circuit so that a differential amplification circuit composed of transistors that use charges as a carrier can be connected at the subsequent stage to the wave-detection circuit.

A first exemplary aspect of an embodiment of the present invention is a start signal detection circuit including: a wave-detection circuit that outputs a voltage in accordance with an envelope of a radio signal from an output point, the radio signal being input from a detection point; a reference voltage generation circuit that outputs a voltage at the output point at a non-signal state as a reference voltage to a reference point; and a differential amplification circuit that amplifies and outputs a voltage difference between the output point and the reference point; wherein the wave-detection circuit includes: a first diode having an anode connected to a power supply through a first current source and an cathode connected to the detection point; a second diode connected between the detection point and a ground; and a first capacitor connected between the anode of the first diode and an alternating ground; wherein the cathode of the first diode serves as the output point; and wherein the differential amplification circuit includes a differential pair composed of transistors that use charges as a carrier.

In an exemplary embodiment of the present invention, the cathode side of the first diode, which serves as a wave-detection diode, is connected to the detection point, and the anode side of the first diode serves as the output point, so that a signal on the low-voltage side of a radio signal is detected. Therefore, a voltage at the output point at a state where no radio signal is detected, i.e., the bias voltage supplied to the differential amplification circuit can be raised. As a result, a differential amplification circuit composed of transistors that use charges as a carrier can be used as the differential amplification circuit at the subsequent stage.

In accordance with an exemplary aspect, the present invention can provide a start signal detection circuit capable of achieving a stable frequency characteristic while keeping the operating voltage at a low voltage.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments in accordance with the present invention are explained hereinafter with reference to the drawings.

First Exemplary Embodiment

Figure 1:
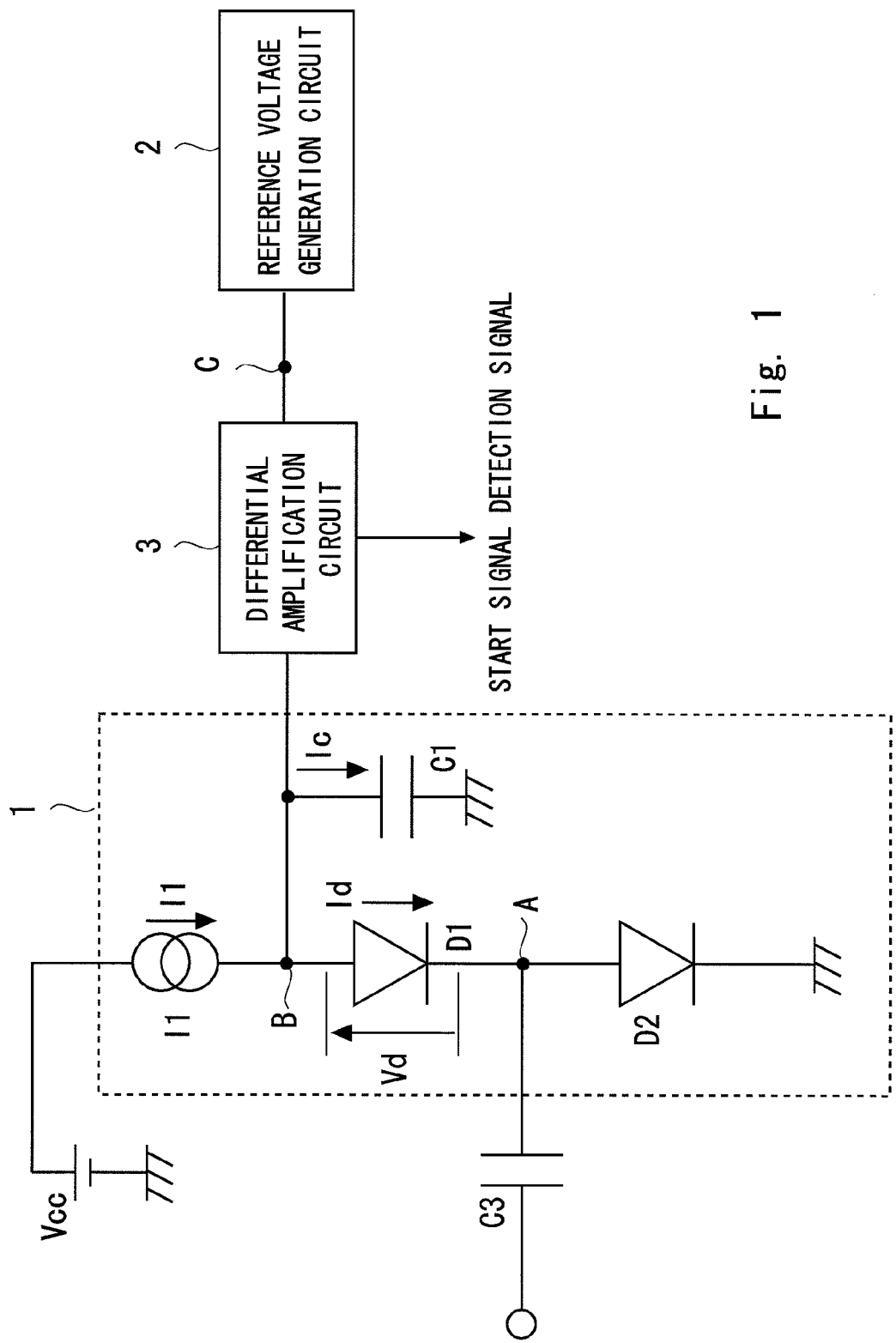
FIG. 1 is a diagram of a start signal detection circuit in accordance with an exemplary embodiment of the present invention.

FIG. 1 shows a configuration example of a start signal detection circuit in accordance with an exemplary embodiment of the present invention. The start signal detection circuit includes a wave-detection circuit 1 that outputs a voltage in accordance with the envelope of a radio signal, which is input from a detection point A, from an output point B, a reference voltage generation circuit 2 that outputs a voltage at the output point B at a non-signal state as a reference voltage to a reference point C, and a differential amplification circuit 3 that amplifies and outputs a voltage difference between the output point B and the reference point C. The wave-detection circuit 1 includes a first diode D1 having an anode connected to a power supply through a first current source I1 and an cathode connected to the detection point A, a second diode D2 connected between the detection point A and a ground, and a first capacitor C1 connected between the anode of the first diode D1 and an alternating ground. The cathode of the first diode D1 serves as the output point B. The differential amplification circuit 12 includes a differential pair composed of transistors that use charges as a carrier. In the following explanation, the first diode D1 is referred to as "wave-detection diode D1".

When an RF signal is input through a wave-detection capacitor C3, the wave-detection diode D1 is configured such that a large current $I_d$ flows when the RF signal swings to the low-voltage side. In this way, when an RF signal is detected, a voltage at an output point B gradually decreases. Meanwhile, a reference voltage generation circuit 2 generates the voltage $V_B$ at the output point B at a non-signal state as a reference voltage, and supplies the generated voltage to a reference point C. A differential amplification circuit 3 receives the voltage $V_B$ at the output point B from one terminal and receives the voltage C at the reference point $V_C$ from the other terminal, amplifies a voltage difference between the output point B and the reference point C, and outputs the amplified voltage difference as a start signal detection signal. The wave-detection diode D1, the second diode D2, the first capacitor C1, and the detection capacitor C3 constitutes a half-wave double voltage rectification circuit. The detection capacitor C3 may also serves as a component of an external matching circuit.

Figure 2:
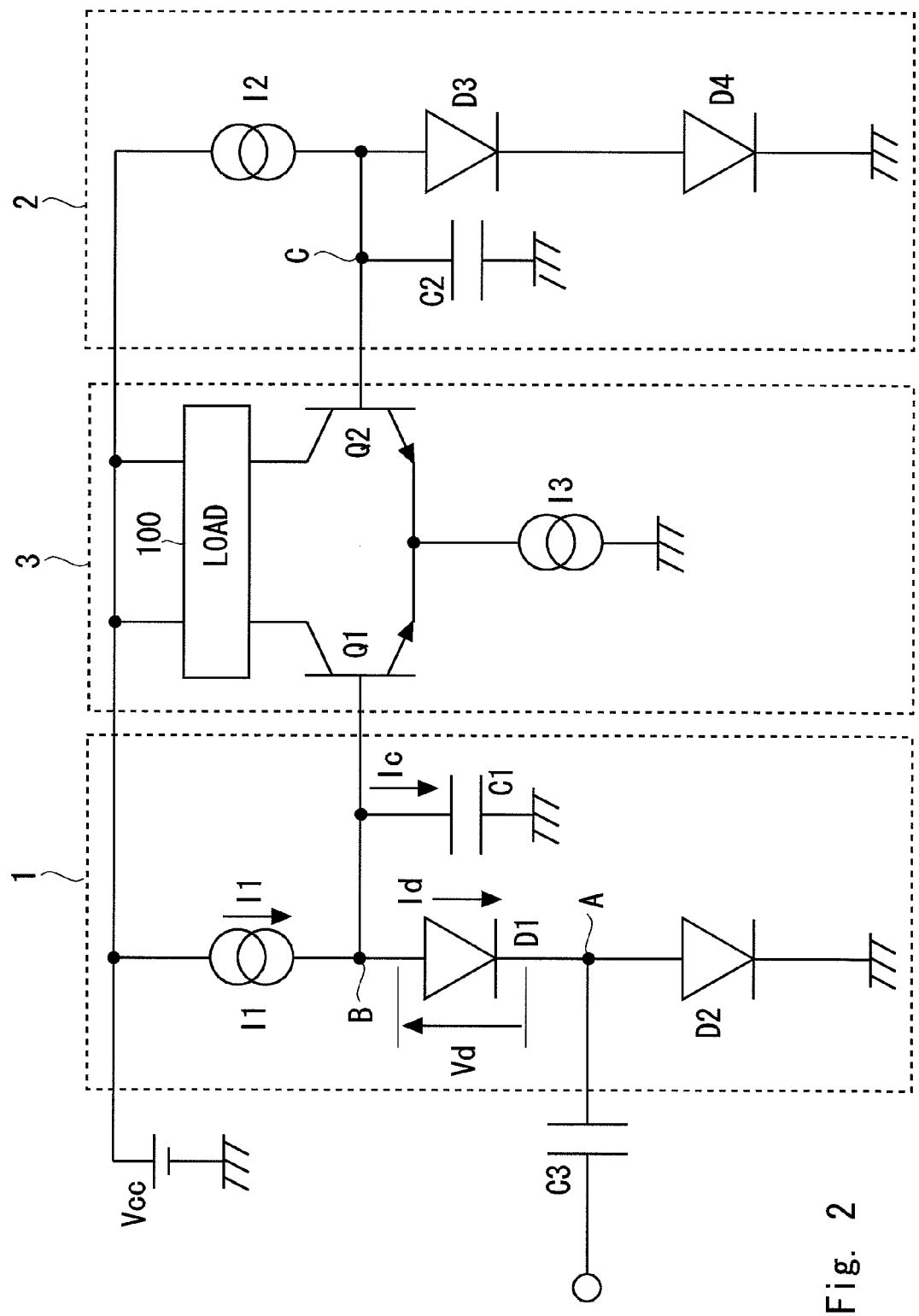
FIG. 2 is a circuit diagram illustrating a detailed configuration example of a start signal detection circuit in accordance with an exemplary embodiment of the present invention.

FIG. 2 is a circuit diagram illustrating a more detailed configuration example of a start signal detection circuit in accordance with an exemplary embodiment of the present invention. The differential amplification circuit 3 includes a first NPN-type transistor Q1 and a second NPN-type transistor Q2 both of which are connected in parallel to each other. The first NPN transistor Q1 and the second NPN transistor Q2 are connected with each other at their emitters. A constant current source I3 is arranged between their connection point and a ground. Note that although a current source composed of a current mirror circuit is typically used as the constant current source I3 in consideration of fluctuations in the power supply voltage and the similar factor, a similar function can be also obtained by using resistors.

A load 100 is connected between the collectors of the first NPN transistor Q1 and the second NPN transistor Q2 and a power supply Vcc. Any given circuit such as a resistive load, an active load using a current mirror composed of transistors, or the like can be used as the load 100. Furthermore, although the differential amplification circuit 3 is explained by using bipolar-type transistors that use charges as a carrier, i.e., the first NPN transistor Q1 and the second NPN transistor Q2 as an example, N-type field effect transistors may be also used.

The reference voltage generation circuit 2 has roughly the same configuration as the wave-detection circuit 1. The reference voltage generation circuit 2 includes a third diode D3, a fourth diode D4, a constant current source I2, and a second capacitor C2. The third diode D3 and the fourth diode D4 corresponds to the first diode D1 and the second diode D2 respectively. They are configured such that transistors have the same size as their corresponding transistors. Furthermore, the constant current source I2 corresponds to the constant current source I1. The constant current source I1 and the constant current source I2 are configured so as to supply the same amount of current as each other. The cathode of the fourth diode D4 is connected to a ground, and the anode is connected to the third diode D3. The anode of the third diode D3 is connected to the base of the second NPN transistor Q2 and the second capacitor C2. The second capacitor C2 is provided to suppress leaks of the RF signal. Therefore, if the leaks of the RF signal are negligible, the second capacitor C2 may be omitted.

The constant current source I2 is arranged between the base of the second NPN transistor Q2 and the power supply Vcc. The other terminal of the second capacitor C2 is connected to a ground. By using roughly the same configurations for the reference voltage generation circuit 2 as the wave-detection circuit 1 as described above, it is possible to make the voltage C at the reference point $V_c$ equal to the voltage $V_B$ at the output point B at a non-signal state. Note that the reference voltage generation circuit 2 does not necessarily have to have roughly the same configuration as the wave-detection circuit 1, provided that it has a circuit configuration capable of generating the voltage $V_B$ at the output point B at a non-signal state.

Figure 3:
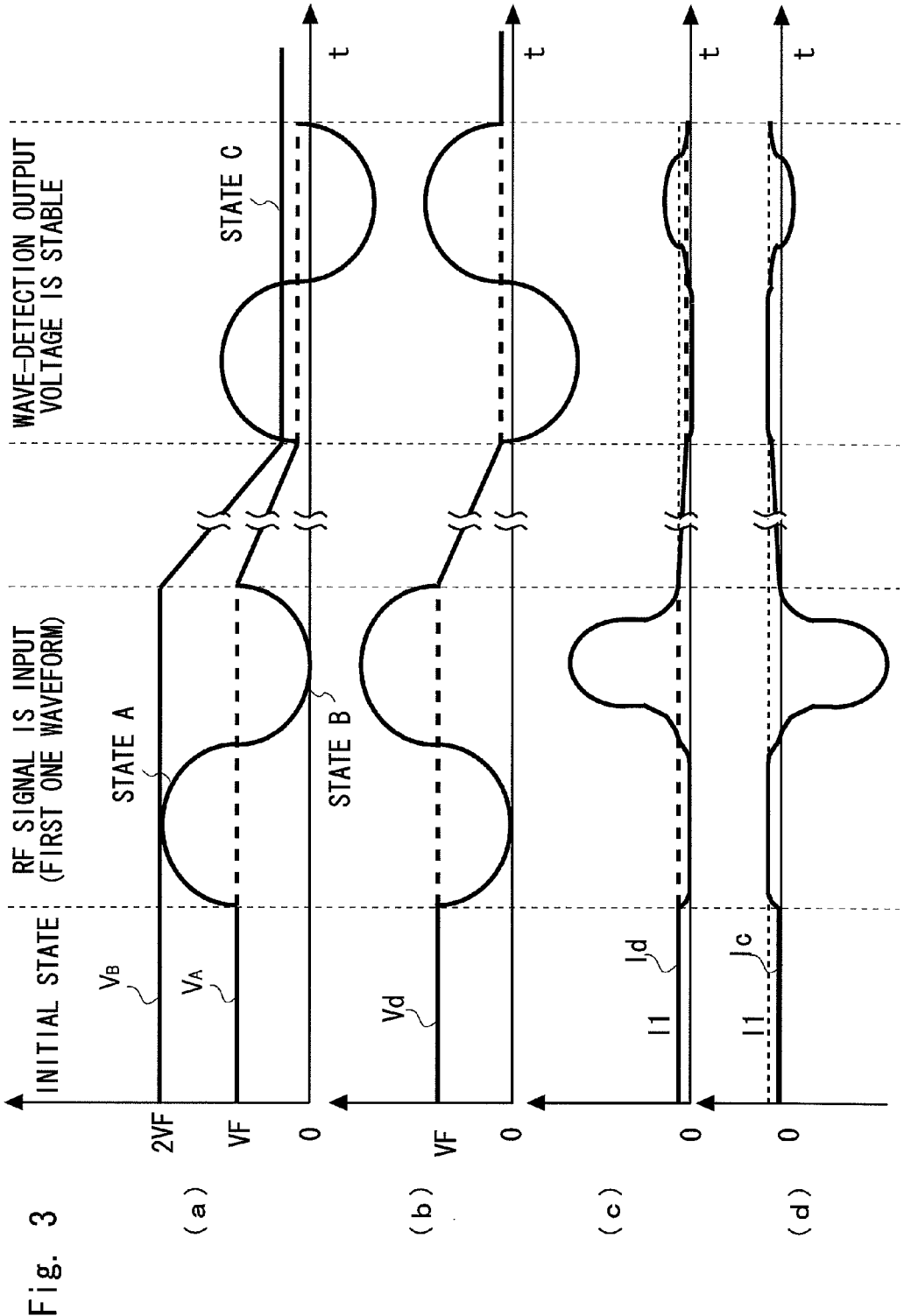
FIG. 3 shows a basic operation from an initial state before detecting an RF signal to a state where the RF signal is detected in a start signal detection circuit in accordance with an exemplary embodiment of the present invention in a simplistic manner.

Next, an operation of a start signal detection circuit in accordance with an exemplary embodiment of the present invention is explained hereinafter with reference to FIG. 3. Assume that the voltage on the cathode side of the wave-detection diode D1, i.e., the voltage at the detection point A is $V_A$, the voltage on the anode side of the wave-detection diode D1, i.e., the voltage at the output point B is $V_B$, the voltage between the anode and the cathode of the wave-detection diode D1, i.e., voltage difference $V_B-V_A$ is $V_d$, the current flowing through the wave-detection diode D1 is $I_d$, the current flowing to the first capacitor C1 is $I_c$, and the current flowing out from the constant current source I1 is $I_1$.

As shown in FIG. 3(a), in an initial state before receiving an RF signal, the forward voltage VF is generated across each of the wave-detection diode D1 and the second diode D2 in accordance with the current $I_1$. The voltage $V_A$ at the detection point A becomes the forward voltage VF. The voltage $V_B$, which is the output of the wave-detection circuit 1, becomes a voltage higher than the voltage $V_A$ by the forward voltage VF of the wave-detection diode D1, i.e., a voltage 2VF.

Figure 10:
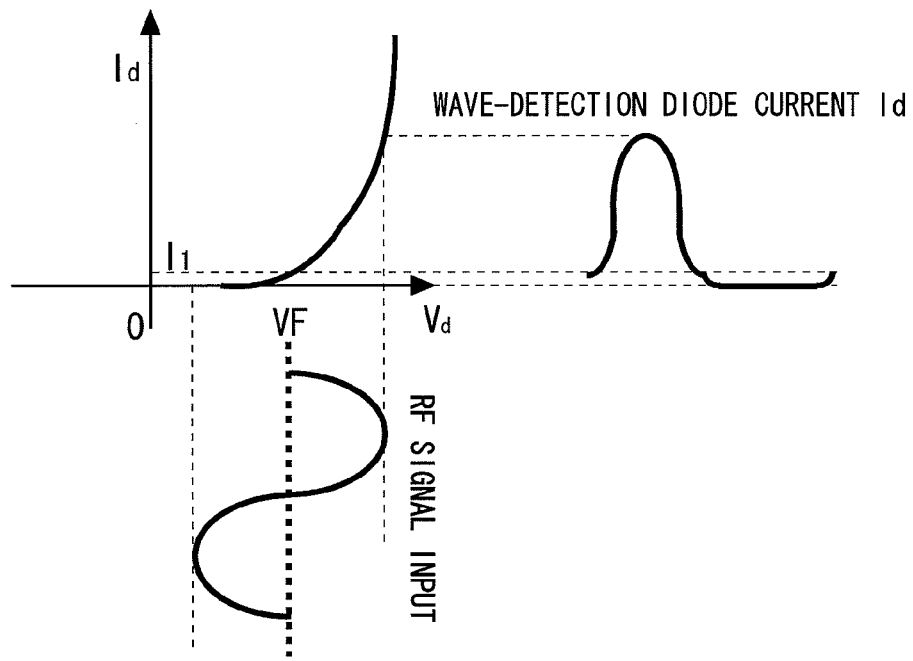
FIG. 10 shows a current-voltage characteristic of a diode in a state where a voltage between the terminals is high.

At this point, when an RF signal is input from the detection capacitor C3, the RF signal is input to the cathode side of the wave-detection diode D1. By examining the first one waveform at this point, it can be seen from FIG. 3(b) that the anode-cathode voltage $V_d$ of the wave-detection diode D1 becomes a voltage obtained by subtracting the input of the RF signal from the forward voltage VF. By referring to the current-voltage characteristic of a diode shown in FIG. 10, it can be seen that a large current flows when the anode-cathode voltage $V_d$ of the wave-detection diode D1 is high, and no or few current flows when the voltage $V_d$ is low. Therefore, as shown in FIG. 3(c), the current $I_1$ supplied from the constant current source I1 flows as the current $I_d$ flowing through the wave-detection diode D1 in the initial state. However, after that, when the RF signal is input and swings to the high-voltage side (state A), a voltage in the reverse direction is generated across the wave-detection diode D1, so that almost no current flows though the wave-detection diode D1 and the current $I_d$ becomes around 0 A. On the other hand, when the RF signal swings to the low-voltage side (state B), the current $I_d$ has a very large current value because a forward voltage is generated across the wave-detection diode D1.

At this point, the current flowing into the first capacitor C1 is expressed as $I_c=I_1-I_d$ based on the current directions. Therefore, as shown in FIG. 3(d), when the RF input swings to the high-voltage side, the current $I_1$ flows into the first capacitor C1, and when the RF input swings to the low-voltage side, a very large current flows out from the first capacitor C1. When the RF signal is being input, the current $I_c$ flowing out from the first capacitor C1 becomes larger than the current $I_c$ flowing into the first capacitor C1, and therefore the voltage between the terminals of the first capacitor C1, i.e., the voltage $V_B$ decreases.

Figure 11:
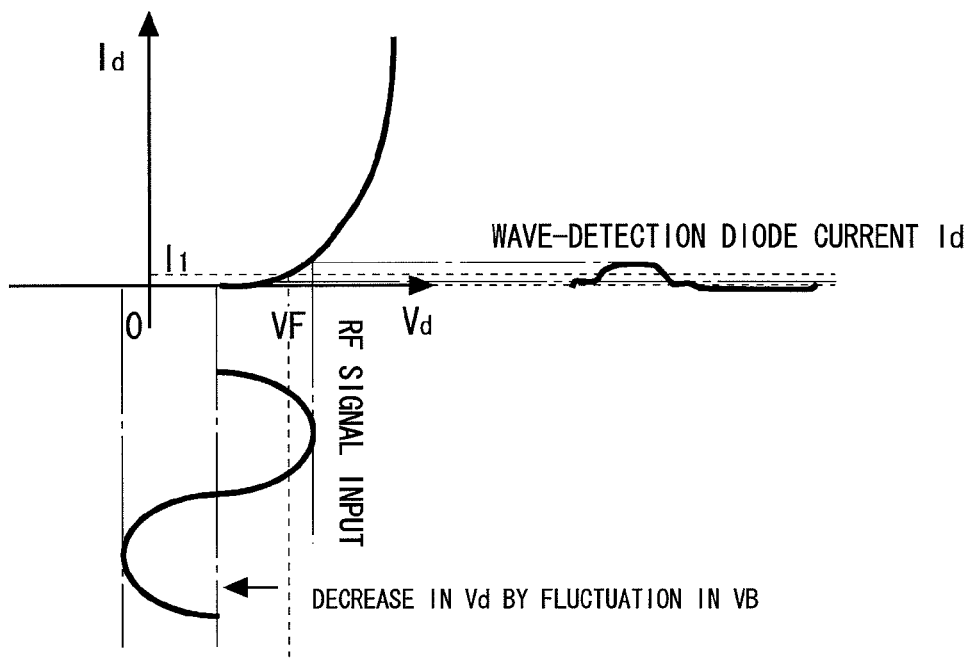
FIG. 11 shows a current-voltage characteristic of a diode in a state where a voltage between the terminals is low.

This behavior is repeated for the second waveform and subsequent waveforms of the RF signal. The voltage $V_B$ at the output point B gradually decreases with the input of the RF signal. FIG. 3 (b) shows the voltage $V_d$ at this state. Since the voltage $V_B$ decreases, the voltage between terminals of the wave-detection diode D1, which is expressed as $V_B-V_A$, also decreases. FIG. 11 shows a current-voltage characteristic of a diode in a state where the anode-cathode voltage $V_d$ is small. With regard to the diode, if the anode-cathode voltage $V_d$ is small, the current $I_d$ flowing through the wave-detection diode D1 exceeds the current $I_1$ when the anode-cathode voltage $V_d$ is at or near its positive peak. Accordingly, in the wave-detection diode D1, only when the RF signal is at or near its peak on the low-voltage side, the anode-cathode voltage $V_d$ of the wave-detection diode D1 is at or near the positive peak, and therefore the current $I_d$ exceeds the current $I_1$.

As shown in FIG. 3(d), based on the current directions, the current $I_c$ flows out from the first capacitor C1 only when the RF signal is at or near the peak on the low-voltage side, and the current $I_c$ flows from the constant current source I1 into the first capacitor C1 in the remaining period. When the current flowing into the first capacitor C1 is balanced with the current flowing out from the first capacitor C1, i.e., when the mean value of the current $I_c$ becomes zero, the wave-detection voltage becomes stable (state C).

After the voltage $V_B$ at the output point B becomes stable, the peak value of the current $I_d$ becomes a value obtained in accordance with the negative peak value of the RF signal. In practice, the voltage $V_B$ at the output point B slightly fluctuates due to fluctuations in the current $I_d$. However, since the voltage $V_B$ exhibits a substantially constant value while the RF signal is being input after the voltage $V_B$ becomes stable, the fluctuations in the voltage is omitted in FIG. 3. By selecting appropriate values for the current $I_1$, the wave-detection capacitor C11, and the first capacitor C10, a voltage $V_B$ in accordance with the negative envelope of the RF signal is obtained from the wave-detection circuit 1. The voltage $V_B$ generated by the wave-detection circuit 1 in this manner is input from the output point B to the differential amplification circuit 3.

Meanwhile, no wave-detection capacitor C3 is connected and no RF signal is input in the reference voltage generation circuit 2, which has roughly the same configuration as the wave-detection circuit 1. The third diode D3, the fourth diode D4, and the constant current source I2 of the reference voltage generation circuit 2 are configured so as to have the same sizes and the same values as those of the wave-detection diode D1, the second diode D2, and the constant current source I1, respectively, of the wave-detection circuit 1. Therefore, the voltage C at the reference point $V_C$, which is the output of the reference voltage generation circuit 2, becomes equal to the voltage $V_B$, which is the output of the wave-detection circuit 1 at a non-signal state, regardless of whether the RF signal is input or not. Specifically, the voltage C at the reference point $V_C$ becomes the combined forward voltages of two serially-connected diodes, i.e., third and fourth diodes D3 and D4. That is, the voltage $V_C$ becomes the voltage 2VF. The voltage C at the reference point $V_C$ is input to the differential amplification circuit 3.

In the differential amplification circuit 3, the voltage $V_B$ from the wave-detection circuit 1 is input to the base of one of transistors constituting a differential pair, i.e., a first NPN transistor Q1, and the voltage $V_C$ from the reference voltage generation circuit 2 is input to the base of the other of the transistors constituting the differential pair, i.e., a second NPN transistor Q2. The difference between the bases of the first NPN transistor Q1 and the second NPN transistor Q2, i.e., the voltage difference between the wave-detection voltage of the RF signal and the voltage at the non-signal state is input to the differential amplification circuit composed of the first NPN transistor Q1 and the second NPN transistor Q2. In the state where no RF signal is input, the base voltages of the first NPN transistor Q1 and the second NPN transistor Q2 are equal to each other. Furthermore, when an RF signal is being input, the base voltage of the first NPN transistor Q1 is lower than the base voltage of the second NPN transistor Q2. A voltage amplified by the differential amplification circuit 3 is obtained as the output of the start signal detection circuit.

In an exemplary embodiment of the present invention, the detection point A is connected to the cathode side of the wave-detection diode D1 and the negative envelope of an RF signal is detected, so that it is possible to make the voltage $V_B$ at the output point B in the initial state where no RF signal is detected equal to the combined forward voltages of two serially-connected diodes, i.e., the voltage 2VF. Note that since the forward voltage VF of a diode using a Si PN-junction is around 0.7 V, the voltage $V_B$ at the output point B in the initial state becomes around 1.4 V. The voltage $V_B$ at the output point B serves as the bias voltage for the differential amplification circuit 3, which is connected at the subsequent stage. Therefore, it is possible to bring the bias voltage to around 1.4 V in an exemplary embodiment of the present invention.

In this exemplary embodiment of the present invention, if the differential amplification circuit at the subsequent stage is composed of NPN transistors, it requires the bias voltage equal to or higher than a voltage obtained by adding the saturation voltage of the first and second NPN transistors Q1 and Q2 to the forward voltage of a diode (0.7 V). It is possible to secure a satisfactory bias voltage (2VF=1.4 V) in this exemplary embodiment of the present invention. The voltage at the connection point of the emitters of the first and second NPN transistors Q1 and Q2 becomes a voltage lower than the base bias voltage by the forward voltage of the first and second NPN transistors Q1 and Q2, i.e., a voltage around 0.7 V. This voltage is sufficiently higher than the saturation voltage of the first and second NPN transistors Q1 and Q2. Therefore, even if a current mirror circuit is used as the current source I3 of the differential amplification circuit, the differential amplification circuit 3 can operate properly without saturating the transistors with a sufficient margin.

Note that a resistor for adjustment may be connected between the bases of the first and second NPN transistors Q1 and Q2 in order to adjust the input impedance of the differential amplification circuit 3. Furthermore, although one terminal of the first capacitor C1 is connected to a ground in this exemplary embodiment, the only requirement for this connection is that it should be connected to a ground in terms of alternating current, and therefore the one terminal of the first capacitor C1 may be connected to the power supply Vcc.

Figure 4:
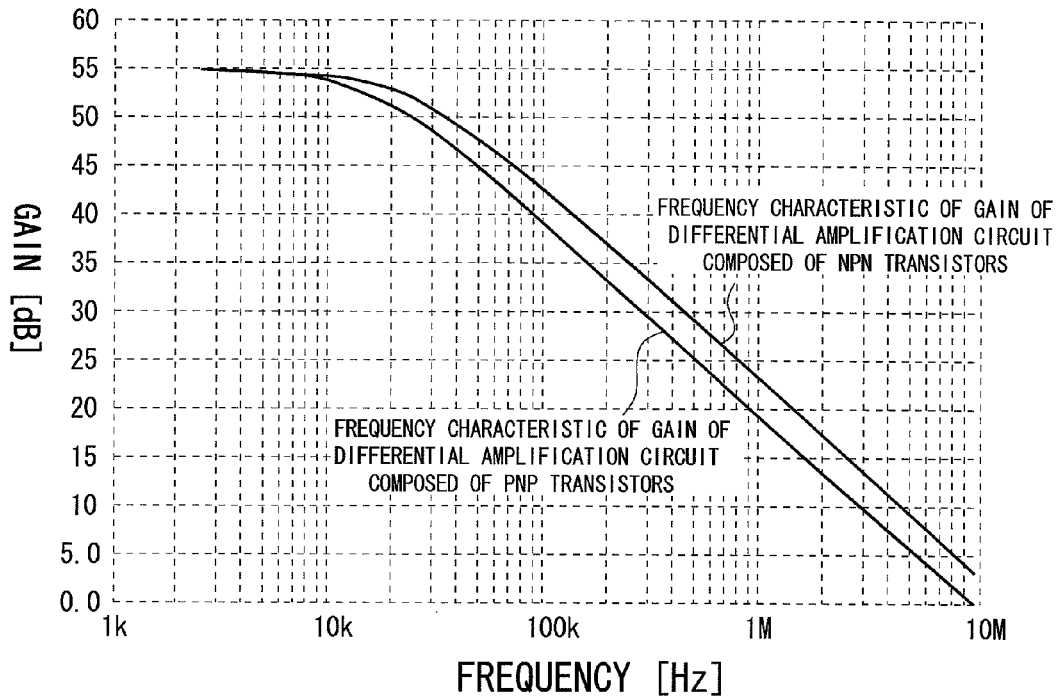
FIG. 4 shows a frequency characteristic of the gain of a differential amplification circuit.

Next, advantageous effects obtained by using NPN transistors in the differential amplification circuit 3 are explained hereinafter. FIG. 4 shows relations between the frequencies [Hz] and the gains [dB] of a differential amplification circuit composed of NPN transistors and a differential amplification circuit composed of PNP transistors. The differential amplification circuit composed of NPN transistors has a better frequency characteristic in a high-frequency band in comparison to the differential amplification circuit composed of PNP transistors.

Figure 5:
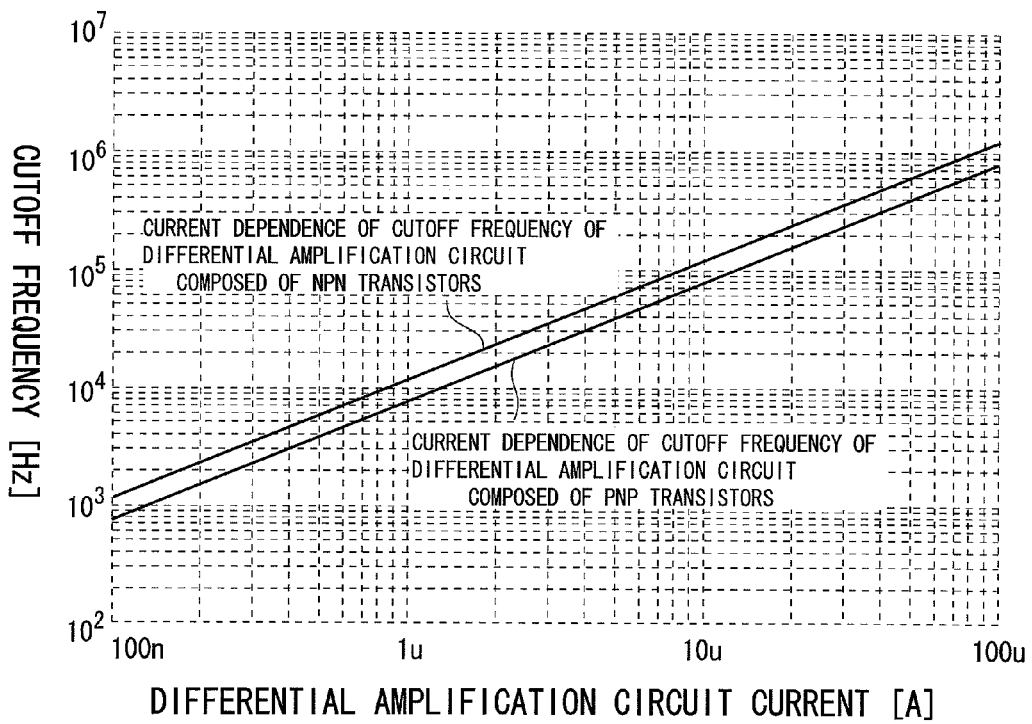
FIG. 5 shows the dependence of a cutoff frequency of a differential amplification circuit on a differential amplification circuit current.

FIG. 5 shows relations between the differential amplification circuit currents [A] and the cutoff frequencies [Hz] of a differential amplification circuit composed of NPN transistors and a differential amplification circuit composed of PNP transistors. As shown in FIG. 5, the differential amplification circuit composed of NPN transistors can attain a given cutoff frequency with a smaller current in comparison to the differential amplification circuit composed of PNP transistors. In particular, in the case of a wake-up circuit, it must be constantly kept in the operating state. Therefore, the fact that the use of a differential amplification circuit composed of NPN transistors can reduces the necessary current provides a significant advantage.

Figure 6:
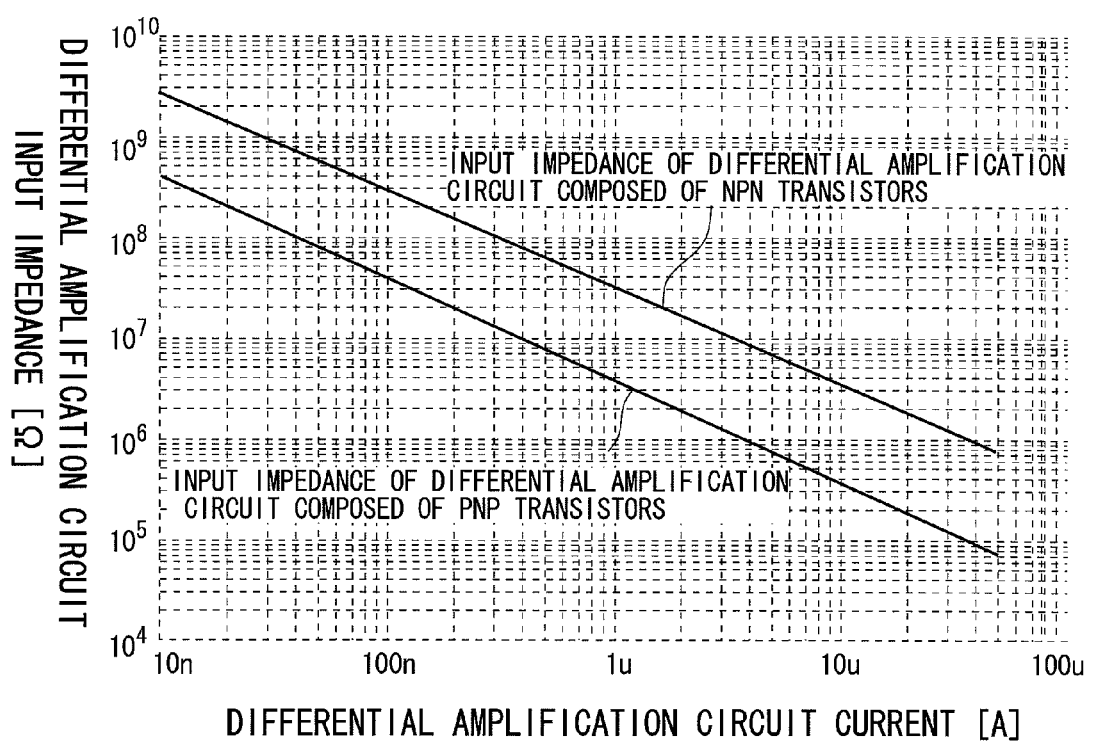
FIG. 6 shows the dependence of an input impedance of a differential amplification circuit on a differential amplification circuit current.

FIG. 6 shows relations between the differential amplification circuit currents [A] and the differential amplification circuit input impedances [Q] of a differential amplification circuit composed of NPN transistors and a differential amplification circuit composed of PNP transistors. Since the input impedance is higher in the differential amplification circuit composed of NPN transistors, a smaller amount of current flows into the differential amplification circuit. Therefore, the electrical load imposed on the preceding stage becomes smaller, and thus providing an advantageous effect that a weaker signal can be measured.

In an exemplary embodiment of the present invention as described above, the wave-detection diode is used in the opposite direction with respect to the RF signal and the bias is applied in such a manner that the wave-detection diode operates in the forward direction, so that operation at a low power supply voltage become feasible even though NPN transistors, which have a better frequency characteristic, are connected at the subsequent stage. Note that the negative envelope at or near the peak is detected when the RF signal swings to the low voltage side in a start signal detection circuit in accordance with this exemplary embodiment of the present invention. However, since either of the inverting output and the non-inverting output can be arbitrarily selected as the output of the differential amplification circuit 3, the output value can be inverted, and therefore an equivalent output to that in the case where the positive envelope is detected can be also obtained.

Second Exemplary Embodiment

Figure 7:
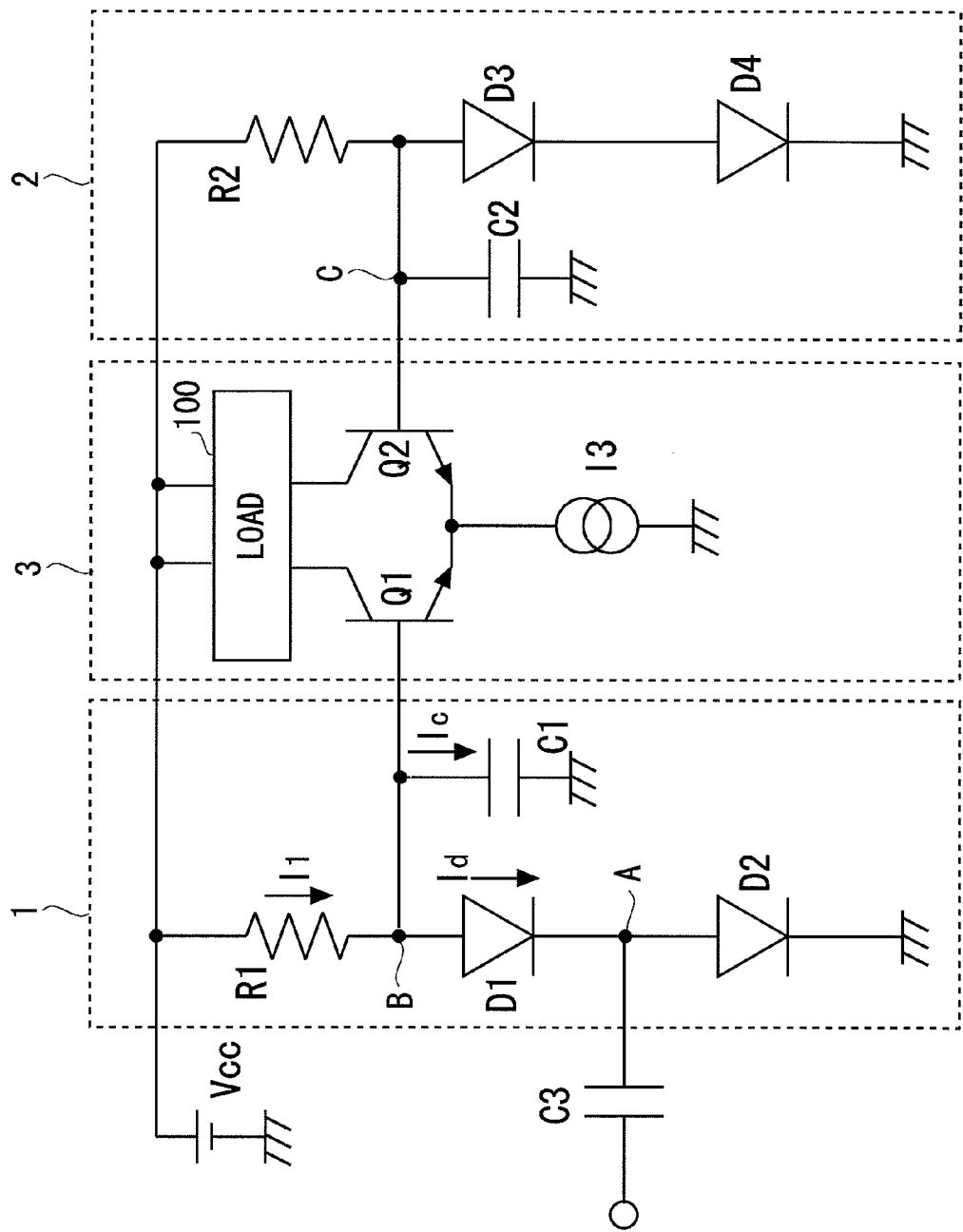
FIG. 7 is a circuit diagram illustrating a detailed configuration example of a start signal detection circuit in accordance with another exemplary embodiment of the present invention.
Figure 8:
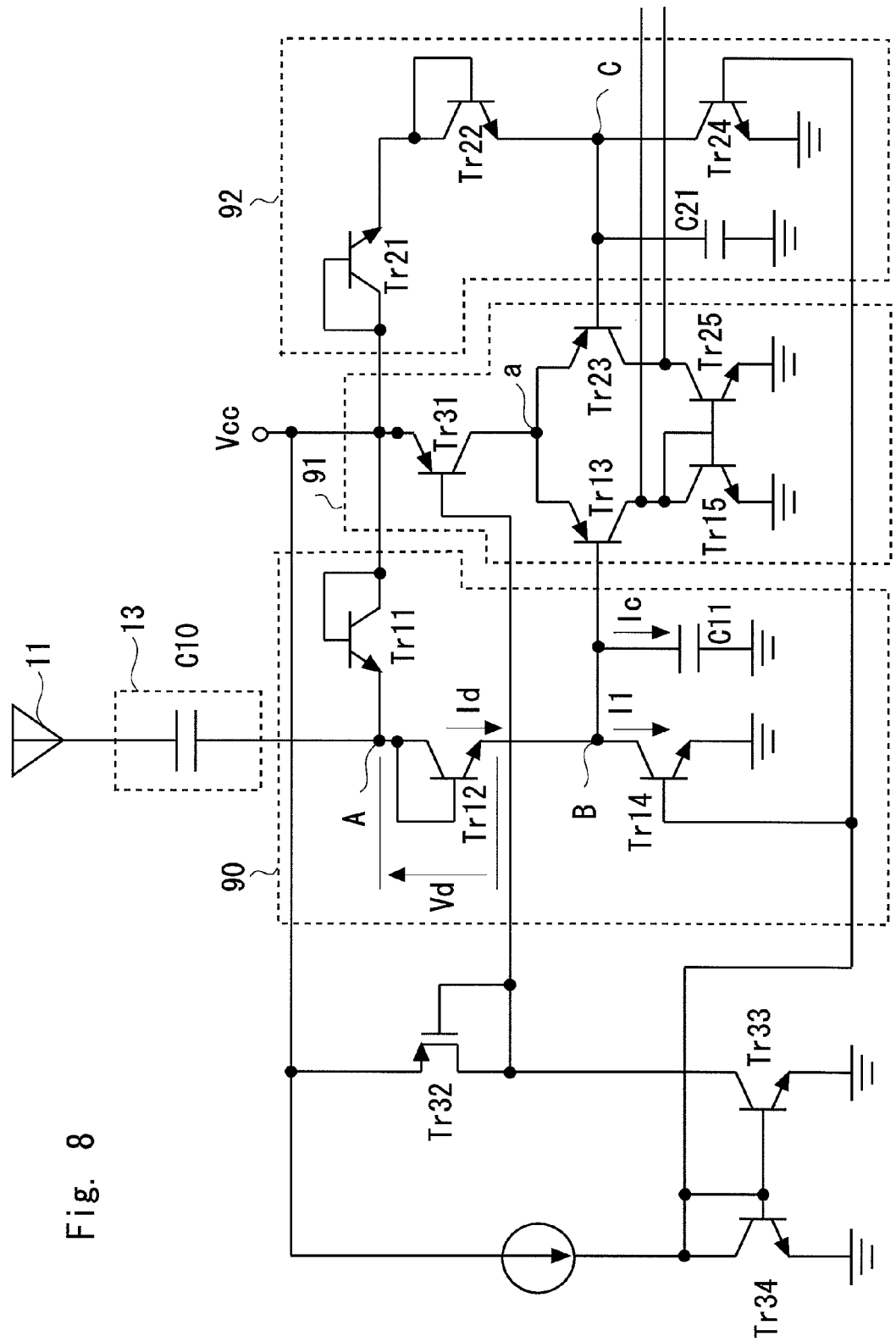
FIG. 8 is a circuit diagram illustrating a configuration of a start signal detection circuit shown in Japanese Unexamined Patent Application Publication No. 2006-174101.
Figure 9:
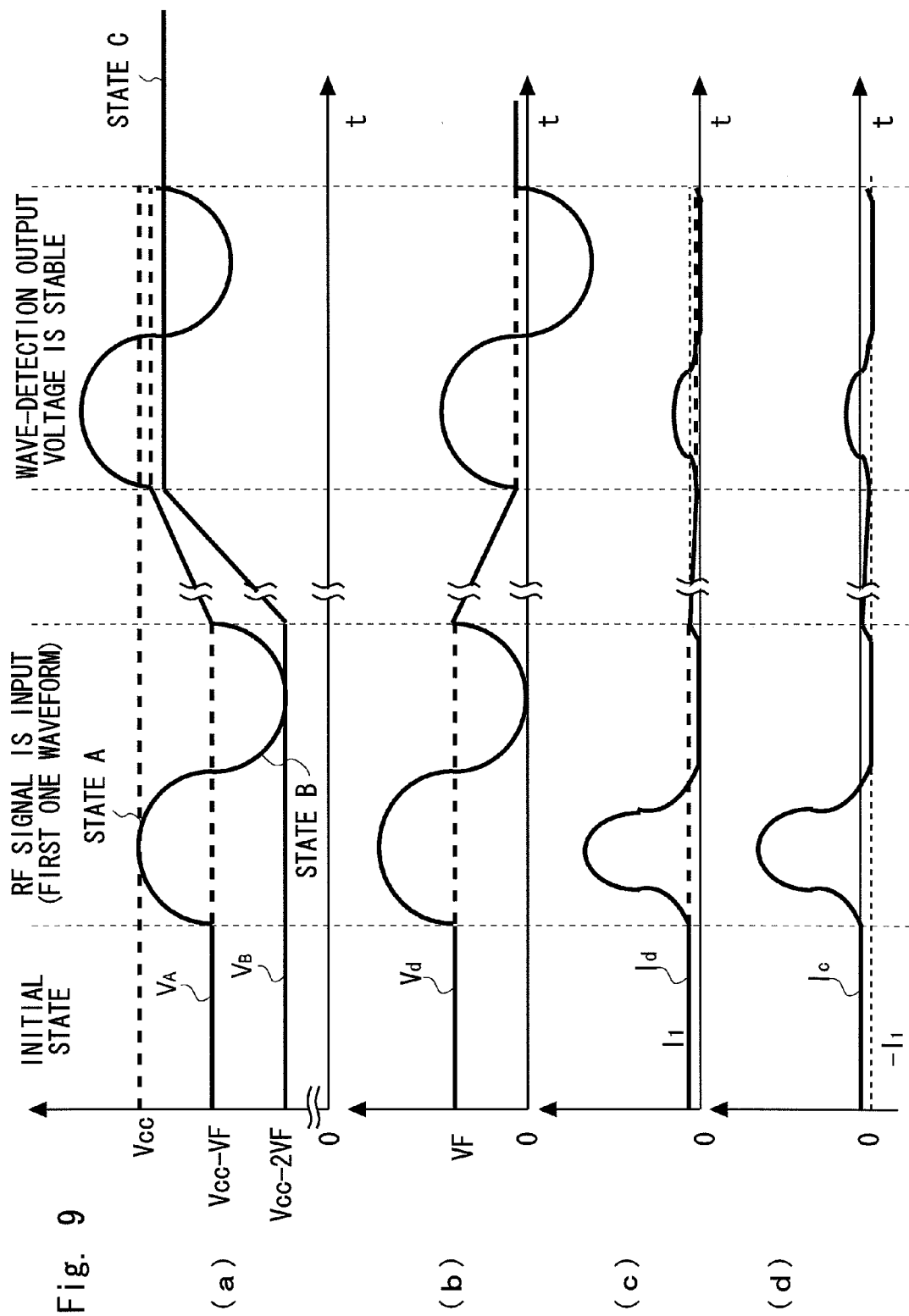
FIG. 9 shows a basic operation from an initial state before detecting an RF signal to a state where the RF signal is detected in a start signal detection circuit shown in Japanese Unexamined Patent Application Publication No. 2006-174101 in a simplistic manner.

FIG. 7 shows a detailed configuration example of a start signal detection circuit in accordance with another exemplary embodiment of the present invention. This exemplary embodiment is characterized in that the constant current source I1 and the constant current source I2 in the previous exemplary embodiment are replaced with resistors R1 and R2 respectively. Note that the other structures are generally the same as those in the previous exemplary embodiment. Therefore, the same signs are assigned to the same structures and their explanation is omitted. Similarly to the previous exemplary embodiment, the third diode D3, the fourth diode D4, and the resistor R2 has the same sizes and the same current-voltage characteristics as those of the wave-detection diode D1, the second diode D2, and the resistor R1, respectively, so that the base bias voltages of first NPN transistor Q1 and the second NPN transistor Q2 become equal to each other.

In the initial state where no RF signal is input, a current satisfying the equation Vcc=2VF+R1×$I_1$ (where VF is the forward voltage of a diode) flows through the wave-detection diode D1, the second diode D2, and the resistor R1. Note that since the third diode D3, the fourth diode D4, and the resistor R2 has the same sizes and the same current-voltage characteristics as the wave-detection diode D1, the second diode D2, and the resistor R1, respectively, as in the case of the previous exemplary embodiment, the same amount of current flows through the third diode D3, the fourth diode D4, and the resistor R2.

When an RF signal is input, if the time constant R1×C1 of the resistor R1 and the first capacitor C1 is sufficiently larger than the cycle of the RF signal, the charge and discharge of the first capacitor C1 does not follows the RF signal, and therefore the voltage $V_B$ at the output point B becomes a voltage obtained in accordance with the envelope on the low-voltage side of the RF signal as in the case of the previous exemplary embodiment. Note that, to prevent distortion in the envelope, the time constant R1×C1 needs to be sufficiently smaller than the cycle of the envelope of the RF signal.

In the previous exemplary embodiment, when the RF signal is turned off after the RF signal is received and the wave-detection output voltage is obtained, a current flows from the constant current source I1 to the first capacitor C1, and thereby the wave-detection output voltage is raised to the voltage of the initial state. At this point, the current flowing into the first capacitor C1 is limited to the current $I_1$ of the constant current source I1. Therefore, depending on the current value $I_1$ of the constant current source I1, the first capacitor C1, the frequency of the envelope of the RF signal, and the similar factor, the rising edge of the waveform sometimes cannot follow the envelope of the RF signal, especially when a signal having a large amplitude is input as the RF signal.

By contrast, since the constant current source I1 in the previous exemplary embodiment is replaced by the resistor R1 in this exemplary embodiment of the present invention, the current flowing into the first capacitor C1 varies in accordance with the voltage $V_A$ at the detection point A. Even when a signal having a large amplitude is input as the RF signal, the current becomes larger in accordance with the amplitude. Therefore, in this exemplary embodiment of the present invention, the time between when an RF signal begins to be input and when the voltage $V_B$ at the output point B becomes a stable state becomes shorter. In this way, even when a signal having large amplitude is input as the RF signal, the rising edge of the waveform can more easily follow the envelope of the RF signal.

Furthermore, the constant current sources $I_1$ and I2 in the previous exemplary embodiment are typically composed of current mirror circuits using PNP transistors. Therefore, in the previous exemplary embodiment, both the PNP transistors constituting the current mirror circuit and the NPN transistors constituting the differential amplification circuit 3 must be formed in the same circuit area, so that an additional process to form the PNP transistors needs to be included in the manufacturing process. By contrast, since no constant current source is used in this exemplary embodiment of the present invention, the start signal detection circuit can be constructed without using any PNP transistor. In this way, no additional process is required, thus enabling cost reduction.

However, in this exemplary embodiment of the present invention, the current flowing through the wave-detection diode D1, the second diode D2, and the resistor R1, and the current flowing through the third diode D3, the fourth diode D4, and the resistor R2 varies in accordance with the voltage of the power supply Vcc. Therefore, this exemplary embodiment may be applied to systems in which fluctuation in the power supply Vcc is tolerable and systems in which fluctuation in the power supply Vcc is small.

Note that the present invention is not limited to the above-described exemplary embodiments, and various modifications can be made without departing from the spirit of the present invention.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A start signal detection circuit comprising:
   a wave-detection circuit that outputs a voltage in accordance with an envelope of a radio signal from an output point, the radio signal being input from a detection point;
   a reference voltage generation circuit that outputs a voltage at the output point at a non-signal state as a reference voltage to a reference point; and
   a differential amplification circuit that amplifies and outputs a voltage difference between the output point and the reference point;
   wherein the wave-detection circuit comprises:
   a first diode having an anode connected to a power supply through a first current source and a cathode connected to the detection point;
   a second diode connected between the detection point and a ground; and
   a first capacitor connected between the anode of the first diode and an alternating ground;
   wherein the cathode of the first diode serves as the output point; and
   wherein the differential amplification circuit includes a differential pair composed of transistors that use charges as a carrier.

2. The start signal detection circuit according to claim 1, wherein the transistors constituting the differential pair are NPN-type bipolar transistors or N-channel-type field effect transistors.

3. The start signal detection circuit according to claim 1, wherein the reference voltage generation circuit comprises a third diode having an anode connected to the power supply through a second current source and a cathode connected to the reference point and, a fourth diode connected between the reference point and a ground.

4. The start signal detection circuit according to claim 3, wherein a first resistor and a second resistor are provided in place of the first current source and the second current source respectively.

5. The start signal detection circuit according to claim 3, wherein the reference voltage generation circuit further comprises a second capacitor connected between the anode of the third diode and the alternating ground.

6. The start signal detection circuit according to claim 1, wherein the differential amplification circuit comprises first and second transistors connected to each other at a connection point of their ground side terminals, a third current source connected between the connection point and a ground, and a load connected between the power-supply side terminals of the first and second transistors and the power supply.

7. The start signal detection circuit according to claim 6, wherein the load is a resistive load or an active load.

* * * * *

UNITED STATES PATENT AND TRADEMARK OFFICE
CERTIFICATE OF CORRECTION

PATENT NO.         : 7,847,599 B2
APPLICATION NO.    : 12/422531
DATED              : December 7, 2010
INVENTOR(S)        : Tomonobu Kurihara It is certified that error appears in the above-identified patent and that said Letters Patent is hereby corrected as shown below:

Column 2, Line 47: delete "$V_d(=V_A-V_B)$" and insert -- $V_d=(V_A-V_B)$ --

Column 10, Line 16: delete "[Q]" and insert -- [$\Omega$] --

Signed and Sealed this
Twentieth Day of September, 2011

David J. Kappos
*Director of the United States Patent and Trademark Office*